US010767256B2

(12) United States Patent
Vittoria

(10) Patent No.: US 10,767,256 B2
(45) Date of Patent: Sep. 8, 2020

(54) METHOD OF ENGINEERING SINGLE PHASE MAGNETOELECTRIC HEXAFERRITE FILMS

(71) Applicant: Carmine Vittoria, Key Biscayne, FL (US)

(72) Inventor: Carmine Vittoria, Key Biscayne, FL (US)

(*) Notice: Subject to any disclaimer, the term of this patent is extended or adjusted under 35 U.S.C. 154(b) by 222 days.

(21) Appl. No.: 15/378,998

(22) Filed: Dec. 14, 2016

(65) Prior Publication Data

US 2017/0169946 A1     Jun. 15, 2017

Related U.S. Application Data

(60) Provisional application No. 62/267,230, filed on Dec. 14, 2015.

(51) Int. Cl.
| | | |
|---|---|---|
| *C23C 14/28* | (2006.01) | |
| *C23C 14/08* | (2006.01) | |
| *H01F 41/20* | (2006.01) | |
| *H01F 10/20* | (2006.01) | |

(52) U.S. Cl.
CPC .............. *C23C 14/28* (2013.01); *C23C 14/08* (2013.01); *H01F 10/20* (2013.01); *H01F 41/205* (2013.01)

(58) Field of Classification Search
None
See application file for complete search history.

(56) References Cited

U.S. PATENT DOCUMENTS

| | | | |
|---|---|---|---|
| 5,227,204 | A | 7/1993 | Vittoria |
| 5,415,901 | A | 5/1995 | Tanaka et al. |
| 5,622,567 | A | 4/1997 | Kojima et al. |
| 6,030,454 | A | 2/2000 | Roeder et al. |
| 2010/0173101 | A1 | 7/2010 | Harris et al. |

OTHER PUBLICATIONS

Geiler (PRL 101, 067201 (2008). (Year: 2008).*
Geiler (APL 91, 162510 (2007)) (Year: 2007).*
Mohebbi M. Magnetoelectric Hexaferrite Thin Films Growth for Next Generation Device Applications. Dissertation. Northeastern University, 2013.
Harris et al. Recent Advances in Processing and Applications of Microwave Ferrites. Journal of Magnetism and Magnetic Materials 321 (2009) pp. 2035-2047.

(Continued)

*Primary Examiner* — Joel G Horning
(74) *Attorney, Agent, or Firm* — Nicholas R. Lewis, P.A.

(57) ABSTRACT

A method of making a ferrite thin film is provided in which a portion of the iron ions in the ferrite are substituted by ions of at least one other metal. The substituting ions occupy both tetrahedral and octahedral sites in the unit cell of the ferrite crystal. The method includes placing each of a plurality of targets, one at a time, in close proximity to a substrate in a defined sequence; ablating the target thus placed using laser pulses, thereby causing ions from the target to deposit on the substrate; repeating these steps, thereby generating a film; and annealing the film in the presence of oxygen. The plurality of targets, the sequence of their ablation, and the number of laser pulses that each target is subjected to, are selected so as to allow the substituting ions to occupy both tetrahedral and octahedral sites in the unit cell.

11 Claims, 6 Drawing Sheets

(56) References Cited

OTHER PUBLICATIONS

Harris et al. Ba-hexaferrite films for next generation microwave devices. J. Appl. Phys. 99, 08M911 (2006).
Wu M. M-Type Barium Hexagonal Ferrite Films. Advanced Magnetic Materials, Dr. Leszek Malkinski (Ed.), InTech (2012).
Geiler A. L. Alternating target laser ablation deposition of high quality barium hexaferrite thin films from barium monoferrite and hematite targets. Journal of Applied Physics 103, 07B914 (2008).
Izadkhah H et al. Deposition of Magnetoelectric Ferrite Thin Films Using Multiple Targets Technique. IEEE Transactions on Magnetics, vol. 52, No. 7, Jul. 2016.
Izadkhah H et al. Effects of cobalt substitutions on the magnetoelectric coupling of M-type hexaferrite films. Applied Physics Letters 106, 142905 (2015).
Mohebbi M et al. First observation of magnetoelectric effect in M-type hexaferrite thin films. Journal of Applied Physics 113, 17C710 (2013).
Wang, L. et al. Electric control of magnetism at room temperature. Sci. Rep., vol. 2, Art. No. 223 (2012).
Ramesh, R. et al. Multiferroics: progress and prospects in thin films. Nature Mater., vol. 6, No. 1, pp. 21-29 (2007).
Fiebig, M. Revival of the magnetoelectric effect. J. Phys. D, Appl. Phys., vol. 38, No. 8, pp. R123-R152 (2005).
Zare S et al. Magnetoelectric sensor excitations in hexaferrite slabs J. Appl. Phys., vol. 117, No. 21, p. 214506 (2015).
Zare, S. et al. Magnetoelectric sensor excitations in hexaferrite films. Appl. Phys. Lett., vol. 106, No. 19, p. 193502 (2015).

\* cited by examiner

METHOD OF ENGINEERING SINGLE PHASE MAGNETOELECTRIC HEXAFERRITE FILMS

CROSS-REFERENCE TO RELATED APPLICATIONS

The present application claims the benefit of U.S. Provisional Patent Application No. 62/267,230 filed on Dec. 14, 2015. The content of that application is hereby incorporated by reference in its entirety.

STATEMENT REGARDING FEDERALLY SPONSORED RESEARCH OR DEVELOPMENT

The invention was made with government support under Grant No. DMR 1002543 from the National Science Foundation and under Grant No. Army W11-NF-0630 from the Army Research Office. The U.S. Government has certain rights in the invention.

BACKGROUND

In magnetoelectric (ME) materials, magnetization and electric polarization may be induced with the application of an electric field and a magnetic field, respectively. Ever since the ME effect was first observed in single phase $Cr_2O_3$ (Astrov, D. N., 1961, *Soy. Phys.JETP*, vol. 13, no. 4, pp. 729-733; and Folen, V. J. et al., 1961, *Phys. Rev. Lett.*, vol. 6, no. 11, pp. 607-608), many other ME materials having high ME coupling coefficient α have been discovered (Ebnabbasi, K. et al., 2012, *J. Appl. Phys.*, vol. 111, no. 7, p. 07C719). In the early stages of development of ME materials, a high ME effect could be observed only at low temperatures, not at room temperature (Srinivasan, G. et al., 2003, *Phys. Rev. B*, vol. 67, no. 1, p. 014418; and Zhao et al., *Sci. Rep.*, vol. 4, June 2014, Art. no. 5255). At present, ME materials are known which are either single phase or composites consisting of piezoelectric and magnetostrictive laminated layers. These materials produce ME effects at room temperature. In particular, hexaferrite materials, both in single-phase bulk form and as films, exhibit sufficiently high α values that they are suitable for making devices such as sensors, circulators, and phase shifters for use at room temperature (Zare, S. et al., 2015, *Appl. Phys. Lett.*, vol. 106, no. 19, p. 193502; Zare, S. et al., 2015, *J. Magn. Magn. Mater.*, vol. 393, pp. 423-428; Ramesh, R. et al., 2007, *Nature Mater.*, vol. 6, no. 1, pp. 21-29; Fiebig, M., 2005, *J. Phys. D, Appl. Phys.*, vol. 38, no. 8, pp. R123R152; and Zare et al., 2015, J. Appl. Phys., vol. 117, no. 21, p. 214506).

Hexaferrites are a large group of ferrites having a hexagonal crystal structure. Based on their compositions and substructures, they are classified into different types, namely M-, U-, W-, X-, Y-, and Z-type. Both the uniqueness of the composition and the arrangement of substructures in a unit cell of a hexaferrite crystal make one hexaferrite distinguishable from another. For example, an M-type hexaferrite, which has the simplest structure among all the hexaferrites, consists of R and S building blocks (also called spinel blocks) with the arrangement RSR*S* (FIG. 2). R* and S* are the same as R and S, respectively, but rotated by 180° around the c axis. In a Z-type hexaferrite, the arrangement of the blocks is RSTSR*S*T*S*. in which again T* is defined similarly to R* and S*. The composition of the S, R and T spinel blocks are $TMFe_2O_4$, $BaFe_4O_7$ and $2BaFe_4O_7$, respectively, where TM represents a transition metal ion and Ba may be replaced by Sr or Pb ions. The chemical formula of a typical M-type hexaferrite is $BaFe_{12}O_{19}$, and those of typical Y- and Z-type hexaferrites are $Ba_2Fe_{12}TM_2O_{22}$ and $Ba_3Fe_{24}TM_2O_{41}$, respectively, The lattice constants along c-axis in the M-, Y- and Z-type hexaferrites are, 22, 43, and 52 Angstroms, respectively. The Z-type hexaferrites, which have the largest unit cell along the c-axis, have the most spinel blocks (RSTSR*S*T*S*).

In general, the greater the number of spinel blocks, the more difficult it is to prepare the hexaferrite in question since hexaferrite phases other than the one desired may admix with the desired phase. For example, the Z-Type hexaferrite, requiring stacking of the most spinel blocks, is indeed the most difficult to prepare as it readily admixes with M- and U-type hexaferrites at the high temperatures needed for its preparation (Pollert, E., 1985, *Progress in crystal growth and characterization*, 11(3): p. 155-205; Kohn, J. et al., 1971, *Science*, 172(3983): p. 519-525; Smit, J. et al., 1959, *Ferrites Philips Technical Library. Eindhoven*, The Netherlands, p. 157; Beblo, M. et al., 1982, *Landolt-Börnstein: Numerical Data and Functional Relationships in Science and Technology-New Series in Landolt-Bornstein: Group* 6: *Astronomy*; Braun P. et al., 1957, Philips Res. Rep, 12: p. 491-548; Albanese, G. et al., 1976, *Journal of Physics C: Solid State Physics*, 9(7): p. 1313; and Wohlfarth, E. P., *Handbook of Magnetic Materials: A Handbook on the Properties of Magnetically Ordered Substances* Vol. 2. 1980: Access Online via Elsevier). In the classic M-type hexaferrite (Ba, Sr)$Fe_{12}O_{19}$, large divalent elements, such as Ba, Pb, and Sr, are located in the R block, where only octahedral sites reside. Only the S block contains tetrahedral sites.

It is a commonly held notion that local distortions or strains induced in the ME hexaferrites due to the replacement of a Ba ion with a smaller Sr ion gives rise to its ME property. This distortion, located in the T block for the Z-type and Y-type hexaferrites, implies that the bonding angle in Fe—O—Fe combination near the Sr substitution is changed from 116° (with Ba) to 123° (with Sr) (Zhao et al., *Sci. Rep.*, vol. 4, June 2014, Art. no. 5255; Wang, L. et al., 2012, *Sci. Rep.*, vol. 2, Art. no. 223; Mohebbi, M. et al., 2013, *J Appl. Phys.*, vol. 113, no. 17, p. 17C710; Tokunaga, Y. et al., 2010, *Phys. Rev. Lett.*, vol. 105, no. 25, p. 257201; Ishiwata, S. et al., 2008, *Science*, vol. 319, no. 5870, pp. 1643-1646; Hiraoka, Y. et al., 2011, *J. Appl. Phys.*, vol. 110, no. 3, p. 033920; Taniguchi, K. et al., *Appl. Phys. Exp.*, vol. 1, no. 3, p. 031301; Soda, M. et al., 2011, *Phys. Rev. Lett.*, vol. 106, no. 8, p. 087201; and Kitagawa, Y. 2010, *Nature Mater*, vol. 9, no. 10, pp. 797-802). This change in bonding angle has implications for the super exchange interaction between the two Fe ions, one occupying an octahedral and the other a tetrahedral site. In ferrites, this combination normally represents the strongest exchange interaction between Fe ions, with the potential to enhance the ME effect exhibited by the hexaferrite. Under strain, this interaction is weakened giving rise to a localized anisotropic exchange which results in a potential spin spiral configuration as described by the Dzyaloshinski-Moriya interaction model (I. Dzyaloshinsky, 1958, *Journal of Physics and Chemistry of Solids*, 4(4): p. 241-255; and T. Moriya, 1960, *Physical Review*, 1120(1): p. 91).

In addition to the substitution of Ba ions with ions of Sr, some of the Fe ions in a hexaferrite may be substituted by cobalt ions (Miller, A., *Landolt-Börnstein: Numerical data and functional relationships in science and technology, Advanced Materials and Technologies*, Berlin, Germany: Springer, 2002). Room temperature ME effect in cobalt-substituted M-type hexaferrite $SrFe_8Ti_2Co_2O_{19}$ has been reported in the bulk (Wang, L. et al., 2012, *Sci. Rep.*, vol. 2, Art. no. 223) as well as in the thin film form of the hexaferrite (Mohebbi, M. et al., 2013, *J. Appl. Phys.*, vol. 113, no. 17, p. 17C710). The change in ME effect brought about by cobalt substitution has been studied in $Sr^{2+}Co_x^{2+}Ti_{3-0.5x}^{4+}Fe_8^{3+}O_{19}^{2-}$ using different amounts of cobalt substituting for iron (Izadkhah, H. et al., 2015, *Appl. Phys. Lett.*, vol. 106, no. 14, p. 142905). This substitution was observed to have a major effect on the value of a measured at room temperature. In the M-type hexaferrite $SrFe_8Co_2Ti_2O_{19}$, it has been suggested that Co and Ti occupy only octahedral sites, 12k, 2a, and 4f2 (Wang, L. et al., 2012, *Sci. Rep.*, vol. 2, Art. no. 223). Since the Ti substituents occupy 12k sites (see FIG. 2), the spin coupling between the S and R blocks is weakened, inducing a spin spiral configuration. It has been suggested that the spin spiral configuration induced by cobalt ion substitution in both M- and Z-type hexaferrites is responsible for the increased ME effect observed in these hexaferrites. Of note, it is assumed that in cobalt substituted ME hexaferrites, Co ions substitute only in the octahedral sites (T. Moriya, 1960, *Physical Review*, 1120(1): p. 91).

There is a need for methods of preparing hexaferrites having an enhanced ME effect.

SUMMARY OF THE INVENTION

Exemplary embodiments of the present technology are directed to methods for making a single phase ferrite thin film exhibiting enhanced ME effect. In this thin film, a portion of the iron ions in the ferrite are substituted by ions of at least one other metal. Importantly, the substituting ions occupy both tetrahedral and octahedral sites in the unit cell of the ferrite crystal. The technology is directed also to ferrite thin films produced using these methods. Further, the technology generally covers a ferrite thin film in which a portion of the iron ions are substituted by one or more other type of metal ions, these ions occupying both tetrahedral and octahedral sites in the unit cell of the ferrite crystal.

In accordance with one aspect of the present disclosure a method of making a ferrite thin film in which a portion of the iron ions in the ferrite are substituted by ions of at least one other metal, the substituting ions occupying both tetrahedral and octahedral sites in the unit cell of the ferrite crystal, is provided. The method includes (a) providing a substrate and a plurality of targets, (b) placing each target, one at a time, in close proximity to the substrate in a defined sequence, (c) ablating the target thus situated using laser pulses, thereby causing ions from the target to deposit on the substrate, (d) repeating steps (b) and (c), thereby generating a film, and (e) annealing the film in the presence of oxygen. The plurality of targets, the sequence of their ablation, and the number of laser pulses that each target is subjected to, are selected so as to allow the substituting ions to occupy both tetrahedral and octahedral sites in the unit cell, whereby the ferrite thin film is produced.

Embodiments of the above exemplary method can include one or more of the following features. The ferrite can be a cubic ferrite. Alternatively, the ferrite can be a hexaferrite of the M-, U-, W-, X-, Y-, or Z-type. In one embodiment, the ferrite is an M-type hexaferrite. In a related embodiment, the M-type hexaferrite has the composition $Sr^{2+}Co_x^{2+}Ti_{3-0.5x}^{4+}Fe_8^{3+}O_{19}^{2-}$, where x ranges from 1.2 to 3.5. For example, x is 2.0.

According to another embodiment of the above exemplary method, two targets, a first target and a second target are provided, the first target being $SrFe_{(4-\delta)}Ti_{0.5\delta}Co_{0.5\delta}O_7$. This target is used to form an R block in the unit cell, δ being either 0 or 0.2. The second target can be $Fe_{(1+0.25\delta)}Ti_{0.5(1-0.25\delta)}Co_{0.5(1-0.25\delta)}O_3$. The second target is used to form an S block in the unit cell. Again, δ can be 0 or 0.2. In some embodiments, laser pulses used for each ablation of the first and the second targets are unequal in number. The substrate is heated to 600° C. Further, step (e) can be carried out at 1050° C. for 40 minutes.

In accordance with a second aspect of the present disclosure, a ferrite thin film made according to the above-described exemplary method is provided. The disclosure also includes an electromagnetic device containing this ferrite thin film.

Embodiments of the ferrite can include one or more of the following features. The ferrite can be a cubic ferrite. Alternatively, the ferrite can be a hexaferrite of the M-, U-, W-, X-, Y-, or Z-type. For example, the ferrite can be an M-type hexaferrite having the composition $Sr^{2+}Co_x^{2+}Ti_{3-0.5x}^{4+}Fe_8^{3+}O_{19}^{2-}$, x ranging from 1.2 to 3.5. In one embodiment x is 2.0. In one embodiment, in the preparation of the M-type hexaferrite having the composition $Sr^{2+}Co_x^{2+}Ti_{3-0.5x}^{4+}Fe_8^{3+}O_{19}^{2-}$, two targets, a first target and a second target are provided. The first target is $SrFe_{(4-\delta)}Ti_{0.5\delta}Co_{0.5\delta}O_7$ and it is used to form an R block in the unit cell. The value of δ can be 0 or 0.2. In a related embodiment, the second target is $Fe_{(1+0.25\delta)}Ti_{0.5(1-0.25\delta)}Co_{0.5(1-0.25\delta)}O_3$. The second target is used to form an S block in the unit cell, δ being 0 or 0.2. According to a further embodiment, the number of laser pulses used for each ablation of the first and the second target are unequal. In certain embodiments of the M-type hexaferrite having the composition $Sr^{2+}Co_x^{2+}Ti_{3-0.5x}^{4+}Fe_8^{3+}O_{19}^{2-}$ the method of preparation requires heating the substrate to 600° C. In one embodiment, the method of preparation requires carrying out step (e) at 1050° C. for 40 minutes.

In accordance with a third aspect of the present disclosure, a ferrite thin film in which a portion of the iron ions of the ferrite are substituted by ions of at least one other metal, the substituting ions occupying both tetrahedral and octahedral sites in the unit cell of the crystals of the ferrite, is provided. Also a part of the disclosure is an electromagnetic device containing this ferrite thin film.

Embodiments of the ferrite thin film according to this aspect of the disclosure can have the following features. The ferrite can be a cubic ferrite. On the other hand, the ferrite can be a hexaferrite of the M-, U-, W-, X-, Y-, or Z-type. In one embodiment, the ferrite is an M-type hexaferrite thin film and the ions substituting iron ions are cobalt ions. For example, the M-type hexaferrite thin film has the formula $Sr^{2+}Co_x^{2+}Ti_{3-0.5x}^{4+}Fe_8^{3+}O_{19}^{2-}$, where x ranges from 1.2 to 3.5. In one embodiment, x is 2.0. According to a further embodiment, the ME coupling coefficient α of this M-type hexaferrite thin film at room temperature is at least $5.0 \times 10^{-9}$ m/s. For example, the ME coupling coefficient α at room temperature is about $5.2 \times 10^{-9}$ m/s. According to yet another embodiment, the saturation magnetization value of this M-type hexaferrite thin film is at least 800 G. For example, the saturation magnetization value is about 2000 G.

BRIEF DESCRIPTION OF THE DRAWINGS

FIGS. 8A and 8C represent films in which $\delta=0$, while FIGS. 8B and 8D represent films in which $\delta=0.2$. In each FIG., upper and bottom curves are XAS and XMRD curves respectively. FIGS. 8C and 8D each show data obtained using XAS (upper half) and XMCD (bottom half), respectively, at the Fe(Co) L2,3 edges. All measurements were taken at T=300K, H=6T and with the X-ray propagation vector parallel to H and at 60 degrees with respect to the surface normal.

DETAILED DESCRIPTION OF THE INVENTION

In accordance with the invention, a method of making single phase magnetoelectric (ME) hexaferrite thin films is described. In this method, pulse laser deposition (PLD) is used to deposit a single phase hexaferrite film at atomic scale on a heated substrate. The method requires mounting multiple oxide targets on a rotating circular carousel and impinging a laser beam on the targets, one target at a time. The laser ablates a first target leading to deposition of its constituents on a substrate placed a small distance away. Deposition from a second target is activated by rotating the carousel and bringing the second target in position for the laser beam to impinge upon. Through a proper selection of (i) targets, (ii) sequence of ablation, and (iii) the number of laser beam pulses impinged upon a target, hexaferrite thin films having composition, crystal structure, and magnetoelectric properties consistent with those of single phase hexaferrite materials may be produced. The method allows preparation of single phase ferrite thin films having enhanced capacity for being magnetized by an applied magnetic or electric field. In the thin films prepared according to this method, iron ions in the unit cell of the hexaferrite crystal are substituted by ions of at least one other metal in such a way that the substituting ions occupy both tetrahedral and octahedral sites in the unit cell. Details of the method are described in the following using preparation of a hexaferrite thin film as an example.

Figure 1:
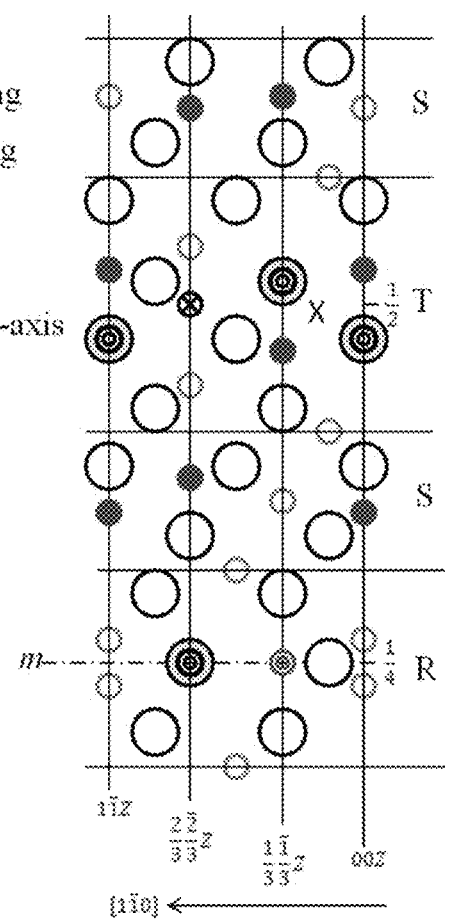
FIG. 1 is a schematic diagram of S, R, and T spinel blocks.
Figure 2:
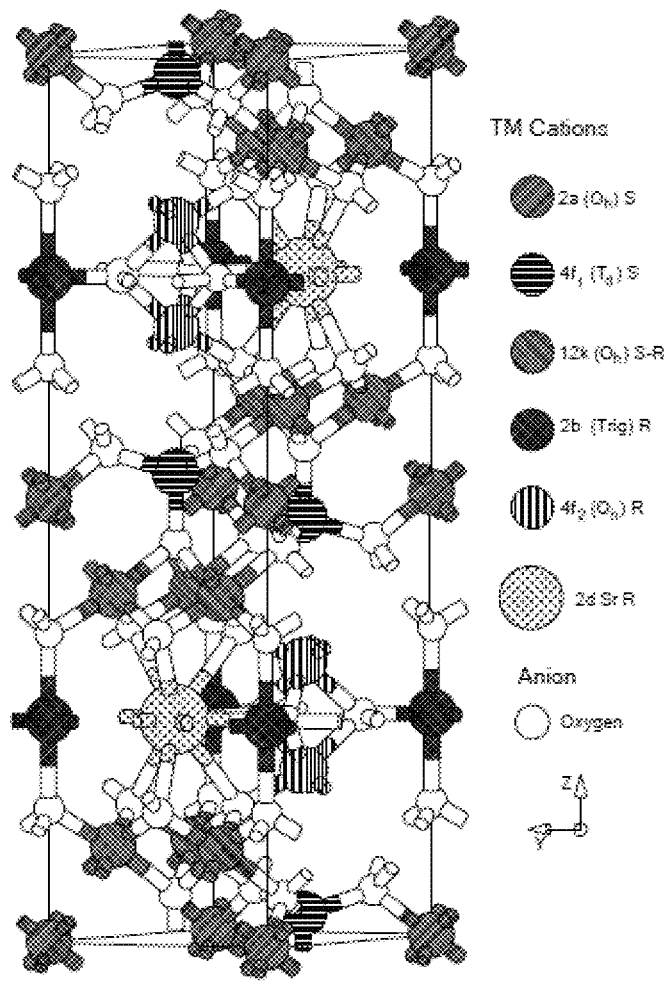
FIG. 2 is a perspective view of the M-type hexaferrite structure showing Wyckoff positions of the cations and co-ordination.

Hexaferrites are classified into different types, namely M-, U-, W-, X-, Y-, and Z-type. In a hexaferrite crystal, the unit cell consists of spinel blocks stacked on top of each other as shown in FIG. 1. Hexaferrites of different types are distinguishable based both on the composition and the arrangement of the spinel blocks in each type of hexaferrite. The simplest of all hexaferrites, the M-type hexaferrite, consists of R and S building blocks with the arrangement RSR*S* (FIG. 1). R* and S* are identical to R and S, respectively, but rotated by 180° with respect to the blocks. The Y and Z-type hexaferrites consist of (STSTST) and (RSTSR*S*T*S*) blocks, respectively. The S, R and T blocks have distinct compositions: $Fe_3O_4$ for S block, $BaFe_4O_7$ for R block, and $Ba_2Fe_8O_{11}$ for T block, where TM represents a transition metal ion and Ba may be replaced by Sr or Pb ions.

Since the blocks do not have the same composition, different targets may be used to deposit each block separately in a way the lattice constants of a single phase hexaferrite are simulated. For example, in the case of an M-type hexaferrite, which contain S and R blocks, two targets may be used. In the preparation of an exemplary M-type hexaferrite of the formula $SrFe_8Co_2Ti_2O_{19}$, described in greater detail below, the target used to deposit S blocks was chosen as $FeCo_{0.5}Ti_{0.5}O_3$ and that to deposit R blocks as $SrFe_4O_7$. The targets were used sequentially to deposit the combination SRS*R* in order to simulate the lattice constant of hexagonal $SrFe_8Co_2Ti_2O_{19}$. The same method may be used to prepare hexaferrite thin films of the U-, W-, X-, Y- or Z-type (with inclusion of a target for T block as needed). The method is applicable to other ferrites, e.g., cubic ferrites, and to oxides in general including piezoelectric and ferroelectric oxides in which the unit cell is made of distinct spinel blocks.

Note that in preparing a thin film having the composition $SrFe_8Co_2Ti_2O_{19}$ using this method, different pairs of targets may be used. As noted above, targets used in the preparation of the exemplary M-type haxaferrite $SrFe_8Co_2Ti_2O_{19}$ were $SrFe_4O_7$ and $FeCo_{0.5}Ti_{0.5}O_3$. When combined, the two targets yield $SrFe_8Co_2Ti_2O_{19}$ ($SrFe_4O_7 + 4FeTi_{0.5}Co_{0.5}O_3 = SrFe_8Ti_2Co_2O_{19}$) Another pair of targets that would also result in the hexaferrite $SrFe_8Co_2Ti_2O_{19}$ may be considered. These two targets have the compositions $SrTi_2Co_2O_7$ and $Fe_2O_3$ and, when combined yield $SrFe_8Co_2Ti_2O_{19}$ ($SrTi_2Co_2O_7+4Fe_2O_3=SrFe_8Ti_2Co_2O_{19}$). Although the final compositions of the two hexaferrites are identical, the two depositions lead to products that have different properties due to the difference in occupancy by particular cations of certain specific sites in the unit cell of each hexaferrite. For example, in the deposition carried out using the first pair of targets, Ti and Co ions deposit in the S block within the unit cell. In the second deposition scheme, the reverse would occur with the Ti and Co ions depositing in the R block, given that each is larger than an Fe ion and can only occupy an R block.

The locations in a unit cell in which the Ti and Co ions reside effects the ME coupling of the hexaferrite. For M-type hexaferrites, tetrahedral sites are located only in the S block. This is true of Y- and Z-type hexaferrites as well. If the Ti and Co ions are placed in the S block, they may occupy tetrahedral as well as octahedral sites, thus affecting local magnetic anisotropy, and consequently, magnetostriction at these sites. Changes in magnetostriction are expected to affect magnetoelectric coefficient α (Vittoria et al., 2014, *Physical Review B*, 89(13): p. 134413). This method of deposition allows Co ions to indeed occupy tetrahedral sites within the S block. See FIGS. 8A-8D.

The number of laser beam pulses impinged on the target determines the thickness of each block. The thickness has to be consistent with the natural thickness of the intrinsic "block" and, as such, cannot be arbitrary. Through repetitive deposition of the S and R blocks lattice constant (c) of the unit cell is simulated. The film thickness is typically much larger than the lattice constant of the crystal.

Thus, in accordance with the above description, the method of making a hexaferrite thin film in which a portion of the iron ions in the hexaferrite are substituted by ions of at least one other metal and in which the substituting ions occupy both tetrahedral and octahedral sites in the unit cell of the ferrite crystal, can be described generally as having the following steps: (a) providing a substrate and a plurality of targets, (b) placing each target, one at a time, in close proximity to the substrate in a defined sequence, (c) ablating the target thus situated using laser pulses, thereby causing ions from the target to deposit on the substrate, (d) repeating steps (b) and (c), thereby generating a film, and (e) annealing the film in the presence of oxygen. The plurality of targets, the sequence of their ablation, and the number of laser pulses that each target is subjected to, are selected so as to allow the substituting ions to occupy both tetrahedral and octahedral sites in the unit cell, whereby the hexaferrite thin film is produced.

In sum, ATLAD, when used with carefully selected parameters, makes it possible to have certain cation substitutions in the unit cell of a hexaferrite, that cannot be achieved using any other means. As a result, single phase hexaferrite thin films are produced that have enhanced capacity for being magnetized by an applied magnetic or electric field.

The ATLAD technique is applicable to other hexaferrites, namely the U-, W-, X-, Y-, and Z-type hexaferrites, to cubic ferrites, ferroelectric oxides, piezoelectric oxides and mixed oxides in general. Similar to hexaferrites, ATLAD may be used with these substances also for placement of ions in crystal sites not favored by natural processes. Accordingly, methods of making single phase thin films having enhanced magnetization or other useful properties from these substancees are within the scope of the present invention. As described above for a hexaferrite, with appropriate selection of targets, sequence of ablation, and the number of laser beam pulses impinged upon a target, thin films having composition, crystal structure, and magnetoelectric properties consistent with those of single phase material of any one of these substances may be produced. Generally, for these substances as well, the method for making a thin film in which a portion of ions of one kind, e.g., iron ions, are substituted by ions of at least one other metal, the substituting ions occupying sites not normally occupied by these ions, would include the following steps: (a) providing a substrate and a plurality of targets; (b) placing each target, one at a time, in close proximity to the substrate in a defined sequence; (c) ablating the target thus situated using laser pulses, thereby causing ions from the target to deposit on the substrate; (d) repeating steps (b) and (c), thereby generating a film; and (e) annealing the film in the presence of oxygen. Optionally, results can be evaluated, e.g., by XRD, and the process repeated with altered parameters such as target composition, target sequence, number of laser pulses, and/or number of cycles of steps (b) and (c), and the results re-evaluated, and optionally another cycle performed with altered deposition parameters.

Methods described above for making the exemplary single phase hexaferrite thin films having enhanced capacity for magnetization are useful in the construction of passive and tunable electromagnetic devices. Typically, parameters of magnetic materials are controlled by an external magnetic field, which allows tuning of device performance. In general, magnetic fields are generated using permanent magnets or current driven coils, leading to a relatively large component size, weight, and cost, as well as slow response time in comparison to semiconductor-based technologies. Materials having stronger ME properties can be a practical solution for controlling the properties of magnetic materials such as ferrites using electric field and/or voltage. This would reduce reliance on permanent magnets and tuning coils. Examples of devices that rely on ME ferrites, for example, ME hexaferrites, include radar and microwave devices such as variable inductors, voltage tunable phase shifters, circulators, tunable filters and noise suppressors for low noise applications.

Further, magnetoelectric materials having high ME coupling constant, such as those described here and methods of making the same are also attractive for use in the construction of highly sensitive magnetic field measurement instruments such as vector field magnetometers which operate in the pT range and are used for medical imaging of the brain. Such materials are also useful in the field of magnetic recording for making highly sensitive read sensors for magnetic recording heads, which directly produce a voltage response without the need for a test current, a property based on ME effect.

Single phase hexaferrite thin films and the methods for making them described in the present invention are useful in the area of magnetic recording as well, e.g., in the production of magnetic recording read heads. Existing magnetic recording read head technologies use one of the two well-known magneto-resistance effects, namely giant magneto-resistance (GMR) effect and tunneling magneto-resistance (TMR) effect, to read data from magnetic recording media. Devices using such technologies require a DC test current to flow through a sensor stack in order to measure change in resistance (i.e., amplitude response signal) as a function of fringing magnetic flux of recorded bits as the reader moves along a recorded track. By using high coupling value ME materials it is possible to have a highly sensitive read sensor for magnetic recording heads that produces a voltage response directly without the need for a test current. Such magnetic read heads have a much simpler sensor construction in terms of both the number of layers required and horizontal biasing needs. Additional advantages include better or similar sensitivity compared to that of TMR heads, reduced power consumption, better thermal performance, and reduced cost of production. Methods described herein are useful also in the area of dynamic tuning of the coercive field of magnetic materials, which is a powerful capability to have in recording disk technology. ME materials make this possible due to coupling between magnetic and electric fields. Of note, magnetic recording of 1 Tbit/in has been reported in multiferroic materials using ME effect, demonstrating that read head technology based on the ME effect can potentially replace conventional magnetoresistive read heads, with considerable advantages.

Hexaferrite thin films of the present invention are also useful for energy harvesting using earth's magnetic field, which is approximately 65 µT. This mechanism would be similar to that described above for medical instruments.

Further, the hexaferrite thin films of the invention are useful in the development of non-volatile memory technology and four state logic devices. The coexistence of several order parameters (ferromagnetism, ferroelectricity, and ferroelasticity) in multiferroics brings about useful physical phenomena and offers possibilities for new device functions. ME coupling enables control of ferroelectric polarization by a magnetic field and, conversely, manipulation of magnetization by an electric field. With multiferroics, multiple order parameters and magnetoelectric coupling may be exploited to produce novel types of memory elements. Given that ferroelectric polarization and magnetization are used to encode binary information in FeRAMs (ferroelectric random access memories) and MRAMs (magnetic random access memories), respectively, coexistence of magnetization and polarization in a multiferroic material allow the realization of four-state logic in a single device. Beyond the combination of ferroic properties in a single device, the electrical control of magnetization via ME coupling offers the opportunity of combining the respective advantages of FeRAMs and MRAMs in the form of non-volatile magnetic storage bits that are switched by an electrical field.

Switching solenoids are also devices in which the hexaferrite films of the present invention can be useful. ME coupling allows switching of a magnetic order by an electric field. This effect can be used in memory devices and is potentially highly energy efficient. It is based on a complex interdependence of the electric and magnetic order in the material. Their coupling is intrinsically strong in magnetically-induced ferroelectrics, among which spin-spiral multiferroics are most prominent. Ferroelectric polarization arises as a consequence of a complex spiral magnetic order. Due to this inherent coupling, spin-spiral multiferroics are promising materials for reliable ME switching.

Further, the single phase hexaferrite thin films described herein are useful in the development of passive AC magnetic sensors. ME effect offers an alternative passive approach to magnetic field sensing at room temperature. Using signal averaging to assist in noise rejection, it has been shown that magnetic field variations as low as about $10^{-11}$ T may be detected at a drive frequency of f=1000 Hz. This involves direct conversion of an input magnetic field H to an electric voltage. The large ME coupling in ME laminates (thin films) makes them attractive as ultrasensitive room temperature magnetic sensors. Field sensitivity and signal-to-noise ratio (SNR) results of ME laminates have shown that ME coefficients used in the development of early ME composites may not be relevant to SNR, and enhancing the magnetorestrictive coefficient, for example, by employing the flux concentration effect, could lead to enhanced SNR. The large coupling effect observed in ME composites; especially in ME laminates consisting of magnetic and ferroelectric components, raises the possibility of their use as room temperature high sensitivity magnetic sensors.

Besides being useful in designs for passive AC magnetic sensors, ME laminates also can be used to make active DC magnetic sensors for DC magnetic field detection. This is made possible by the fact that ME effect is a strong function of DC magnetic field $H_{dc}$. Thus, by using a constant $H_{ac}$ drive, ME laminates have the potential to be used for small $H_{dc}$ signal detection. It has been found that small long-type ME laminates are quite sensitive to small DC magnetic field ($H_{dc}$) variations when driven by a constant AC magnetic field. The sensitivity limit is $H_{dc}<10^{-3}$ Oe ($10^{-7}$ Tesla) using a constant amplitude low frequencies drive and $H_{dc}<10^{-4}$ Oe ($10^{-8}$ Tesla) under resonant drive (Srinivasan, G., 2010, *Magnetoelectric composites, Annual Review of Materials Research*, 40: p. 153-178).

Single phase hexaferrite thin films described herein also can be used for making steel stress monitoring sensors. Monitoring of stress in structural components made of steel, while they are in service, is challenging but useful for structural safety and health evaluation. Elasto-magnetic (EM) sensors are promising for stress monitoring of steel structural components because of their great capabilities for actual stress measurement, noncontact monitoring, and long service life. However, low sensitivity, low signal-to-noise ratio, slow response, and complicated installation of EM sensors limit their application flexibility. It has been shown that owing to their high sensitivity, real-time response, and good linearity, steel stress monitoring sensors (SSMS) having an ME sensing unit can overcome the drawbacks intrinsic to conventional EM sensors (Fiebig, M., 2005, *Journal of Physics D: Applied Physics*, 38(8): p. R123). Thus, SSMS, which are easy to install, can be used for high-sensitive, fast-responding, and real-time monitoring of stress in steel structural components.

The hexaferrite thin films described herein also can be used to make geomagnetic sensors.

Further, the hexaferrite thin films can be used for producing fluxgate sensors. These sensors are used to detect small magnetic fields in space, medical instruments, and in security applications. They tend to be fairly hefty, but with the use of ME hexaferrite materials the size may be reduced to the size of a computer chip.

Owing to their large magnetization capacity, hexaferrite thin films described herein may be used also for making improved magnetoelectric gyrators. A magnetoelectric gyrator is a device that can convert not only active and reactive impedances, but also current and voltage.

Hexaferrite thin films of the present invention also can be used in integrated circuits (ICs) for computer memories. ICs are used in all facets of electronic industry: computer, domestic markets, solar energy, etc. Most ICs are fabricated on single chips or substrates. ME hexaferrites also can be fabricated on similar substrates or chips. These new advanced materials are unique in that they are small and yet allow inductance to be varied easily.

The hexaferrite thin films of the present invention also can be used in making novel integrated magnetic elements to replace semiconductors. Controlling voltages of ME hexaferrite materials being low, i.e., in the mV range, they are compatible with semiconductor voltage requirements. Thus, ME hexaferrite materials may be adapted for use in the design of logic circuits. In addition, ME hexaferrite materials can be used as amplifiers where the impedance requirements complement those of transistor amplifiers.

ME hexaferrites of the present invention also can be used in MEMS devices. MEMS/NEMS resonators have been explored as low cost, miniature, and efficient single-chip RF solutions for advanced wireless communication systems (Rinaldi, M. et al., 2010, *IEEE transactions on ultrasonics, ferroelectrics, and frequency control*, vol. 57, 38). An important feature of these devices is that they can be tuned over a wide frequency spectrum. ME hexaferrites are compatible with piezoelectric materials currently in use and can provide the necessary latitude to perform tuning both efficiently and at low cost.

ME hexaferrites of the present invention also can be used to reduce power consumption for biasing magnetic material. It is well known that biasing magnetic material requires permanent magnets and large currents. Owing to their high capacity for magnetization, use of the presently described ME hexaferrites reduces the demand for high power consumption means for biasing magnetic materials.

Without further elaboration, it is believed that one skilled in the art can, based on the description above, utilize the present invention to its fullest extent. The specific examples below are to be construed as merely illustrative and not limitative of the remainder of the disclosure in any way whatsoever.

EXAMPLES

Example 1

Preparation and Characterization of an M-Type Hexaferrite Thin Film

Preparation

Targets were prepared using conventional ceramic techniques. Stoichiometric amounts of high purity CoO (99.995%), SrO (99.5%), $TiO_2$ (99.8%), and $Fe_2O_3$ (99.8%) were ball milled for 4 hours to obtain a powdered mixture. The powdered mixture was pressed into a disk and sintered at 1150° C. for 16 hours. Oxygen was introduced into the furnace while the disk was being sintered to increase its density and to also compensate for possible oxygen loss. The disk was crushed and ball milled again after adding polyvinyl alcohol to increase the density and stickiness of the powder obtained. The powder was subjected to a pressure of 2000 psi and sintered for 16 hours at 1150° C. The same procedure was used for producing targets for both single and multiple target (ATLAD) depositions. The composition of each target was characterized by energy dispersive spectroscopy (EDS). Crystal densities were found typically to be at least 4.1±0.12 g/cm³ compared with the ideal value of 5.3 g/cm³ (R. Lefever, *Landolt-Bornstein: Numerical Data and Functional Relationships in Science and Technology*, vol. 3, K.-H. Hellwege and A. M. Hellwege, Eds., Berlin, Germany: Springer, 1980, pp. 61-62).

Films were deposited on sapphire single crystals using pulsed laser deposition. In both single target and multiple target (ATLAD) methods, the temperature of the substrate was 600° C. and the oxygen pressure within the vacuum chamber was kept at 200±5 mtorr. EDS measurements were performed to determine the composition of the films.

The typical composition of a film obtained using single target was $Sr^{2+}Co_x^{2+}Ti_{3-0.5x}^{4+}Fe_8^{3+}O_{19}^{2-}$. The range of the cobalt deposition was in the range from x=1.2 to 3.5. Stacking coefficients of the elements were different. For example, Sr and Co did not deposit at the same rate.

Next, the ATLAD technique was used to deposit a film having the composition $SrFe_8Ti_2Co_2O_{19}$ (which is $Sr^{2+}Co_x^{2+}Ti_{3-0.5x}^{4+}Fe_8^{3+}O_{19}^{2-}$). In the deposition, R block deposition was simulated by depositing from a target having the composition $SrFe_{(4-\delta)}Ti_{0.5\delta}Co_{0.5\delta}O_7$. On the other hand, S block deposition was simulated by depositing from a target of having the composition, $Fe_{(1+0.25\delta)}Ti_{0.5(1-0.25\delta)}Co_{0.5(1-0.25\delta)}O_3$. Two samples were grown, one with δ=0 and the other with δ=0.2.

A trial and error approach was used to deposit the film. For example, the number of laser pulses impinging upon one of the targets was fixed and that on the other target was varied. This process was repeated. Deposition from both targets was done sequentially. Deposited films were post-annealed in oxygen at 1050° C. for 40 minutes in order to increase the resistivity of the sample and to improve magnetic properties.

After the film was deposited, (1) XRD was performed to confirm that the film had a hexagonal crystal structure, (2) composition was measured to ensure that it was the same as $SrFe_8Ti_2Co_2O_{19}$, and (3) magnetization and uniaxial magnetic anisotropy were measured and compared with results derived from films prepared from a single target. After a large number of iterations, an optimal growth process yielding a film that satisfied the above three criteria was established. The optimum pulse ratio for deposition of R and S blocks was found to be 8:30. In other words, more pulses were required to simulate the S block. It is noted that irrespective of the value of δ of the targets, the chemical formula, $SrFe_8Ti_2Co_2O_{19}$, was held constant. It was found that for δ=0, Ti and Co ions were placed only in the S block.

Characterization

Figure 3:
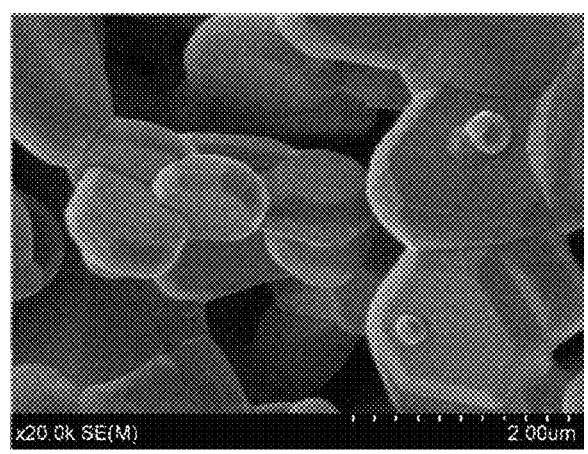
FIG. 3 is a scanning electron microscopy (SEM) image of a hexaferrite thin film deposited by ATLAD and post-annealed for 40 min at 1050° C.

Surface morphology of the film obtained using ATLAD was studied by scanning electron microscopy (SEM). The observed polycrystalline structure of the film is shown in FIG. 3. The size of the hexagonal crystallites was about 1.5 μm. Increasing the annealing time up to 50 min increased crystal formation, which was verified by both XRD and VSM data. VSM data also confirmed that post-annealing, when performed for over an hour, led to mixing of ferrite phases and induced an interfacial region in which ions from the substrate admix with those in the film. The deposition parameters of ME hexaferrite obtained are shown in Table I.

TABLE I

Composition of the M-type hexaferrite thin film deposited by the ALTAD technique

| Fe/Sr | Co/Sr | Ti/Sr | Co/Ti |
|-------|-------|-------|-------|
| 8.63  | 2.37  | 2.14  | 1.01  |

Careful analysis of the XRD data revealed minimal amount of mixed phase containing spinel ferrite, which was difficult to detect by VSM or ferromagnetic resonance (FMR) measurements.

Figure 4:
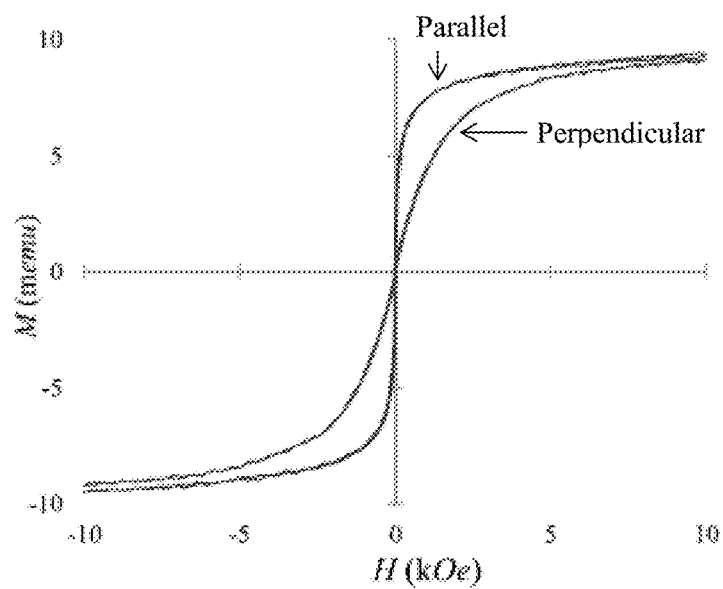
FIG. 4 is a set of two Vibrating sample magnetometer (VSM) traces of a film deposited by ATLAD and post-annealed for 40 min at 1050° C.

Static magnetic parameters were measured using VSM on films of $SrFe_8Ti_2Co_2O_{19}$ deposited both from single target or from multiple targets (ATLAD). See FIG. 4. Hysteresis loop measurement data for films made using ATLAD, obtained with the static magnetic field applied both parallel or perpendicular to the film plane, were in agreement with those for films made using single target deposition. In the film deposited by the ATLAD technique, saturation magnetization value 4πMs was measured to be about 2000 G, which is remarkably higher than that measured for the same film deposited by single target method (Mohebbi, M. et al., 2013, *J. Appl. Phys.*, vol. 113, no. 17, p. 17C710; Izadkah et al., 2015, *Appl. Phys. Lett.*, vol. 106, no. 14, p. 142905). The film deposited by ATLAD had α measured a of 5.2×10⁻⁹ sec/m. The value of α obtained using single target deposition was 20% lower.

Figure 5:
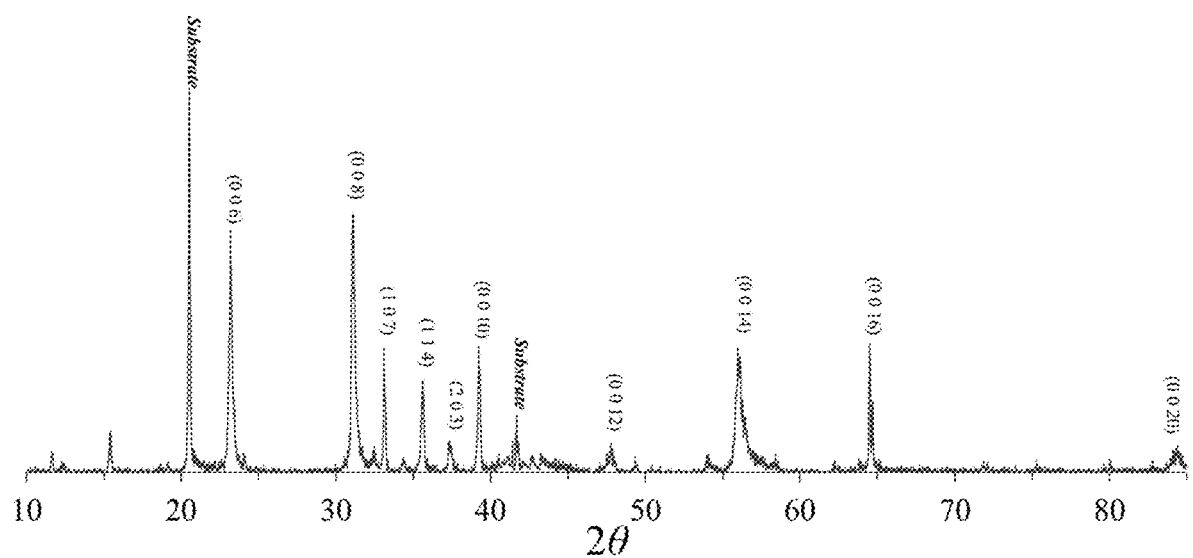
FIG. 5 is an X-ray diffraction (XRD) spectrum of a film deposited by ATLAD and post-annealed for 40 min.

Comparing the XRD patterns before and after annealing showed that all of the deposited crystallized films were mostly M-type hexaferrites. Only a minimal amount of amorphous phase was observed. As shown in FIG. 5, mixed phases of ferrites appear to be present in the film. However, these phases are minimal, since the VSM (FIG. 4) measurements reveal mostly, a single-phase pattern.

Figure 6:
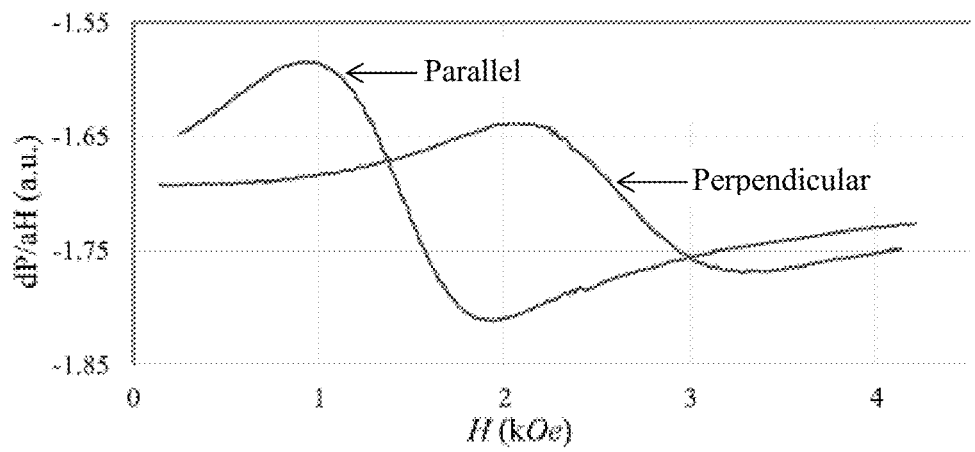
FIG. 6 is a ferromagnetic resonance (FMR) profile of an M-type hexaferrite thin film deposited by ATLAD with magnetic field applied both parallel and perpendicular to the film plane.

FMR was utilized to measure magnetization both when the magnetic field was applied parallel (H∥) and perpendicular (H™) to the film plane. Data were obtained both from films deposited from a single target (Izadkhah et al., 2015, *Appl. Phys. Lett.*, vol. 106, no. 14, p. 142905) and multiple targets (FIG. 6). Disregarding magnetic anisotropy, FMR can be expressed as:

$$f = 1.4 \times g \times 10^6 (H_{195} - 4\pi MS) \qquad (1)$$

$$f = 1.4 \times g \times 10^6 \sqrt{(H_\parallel (H_\parallel + 4\pi M_s)} \qquad (2)$$

where g is the g-factor, $M_s$ is saturation magnetization, and $H_\perp$ and $H_\parallel$ are applied fields in perpendicular and parallel configurations, respectively (Vittoria, C., 2011, *Magnetics, Dielectrics, and Wave Propagation With MATLAB Codes*, vol. 17. Boca Raton, Fla., USA: CRC Press, 2011, p. 450). This simpler analysis revealed the g factor to be about 3.6. Although this value is inconsistent with the typical value of g of about 2 for M-type hexaferrites, if a uniaxial magnetic anisotropy field $H_A$ of about 2000 Oe is included in the above FMR conditions (1) and (2), a g value of about 2 is obtained. This result implies that the spin configuration of the film is that of a spin spiral (Moria, T, 1960, *Phys. Rev.*, vol. 120, no. 1, p. 91) which can be represented by a term like $H_A$ (Vittoria, C., 2015, *Phys. Rev. B*, vol. 92, no. 6, p. 064407).

Example 2

Confirmation of Spin-Spiral Configuration in ME Films Deposited by ATLAD

Figure 7:
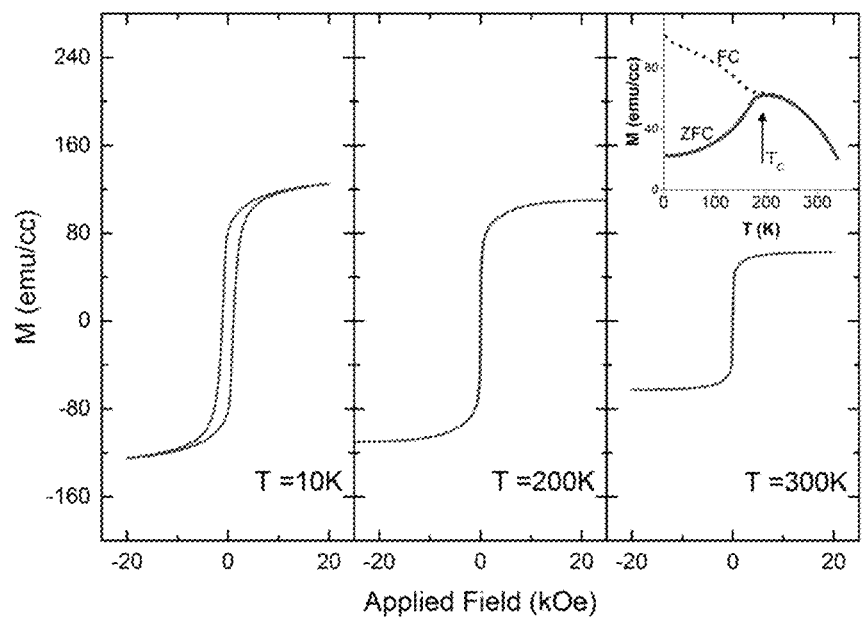
FIG. 7 is a set of VSM magnetometry traces of an M-type hexaferrite thin film deposited by ATLAD measured at 10, 200, and 300K. The inset shows the FC (field cooled) and ZFC (zero field cooled) M vs. T data measured at 300 Oe.

VSM measurements were performed at temperatures 10K, 200K and 300K to determine the magnetic moment (M) of the hexaferrite thin films as a function of applied magnetic field. Thin films produced using targets having compositions $SrFe_{(4-\delta)}Ti_{0.5\delta}Co_{0.5\delta}O_7$ and $Fe_{(1+0.25\delta)}Ti_{0.5(1-0.25\delta)}Co_{0.5(1-0.25\delta)}O_3$, $\delta$ being either 0 or 0.2 were used for the measurements. Data obtained using films made only with $\delta=0$ are shown in FIG. 7. Magnetic moment was also determined as a function of temperature under conditions of zero field cooling (ZFC) and field cooling (FC). See FIG. 7 inset. Under FC conditions, magnetization was observed to steadily decrease with increase in temperature, as one would expect for a ferro/ferrimagnet material. However, around 160K, the slope of M vs T flattened before falling sharply. This effect has been seen in other hexaferrites and attributed to a change from a pure ferrimagnetic order to a spin spiral order with an easy cone of magnetization. This behavior was also found in films having a composition in which $\delta=0.2$, except that a shallower and nearly linear decrease in M over the same temperature range was observed. For the ZFC curves a peak was observed for both $\delta=0$ and 0.2.

Example 3

Confirmation of Tetrahedral Occupancy by Co Ions

Figure 8A:
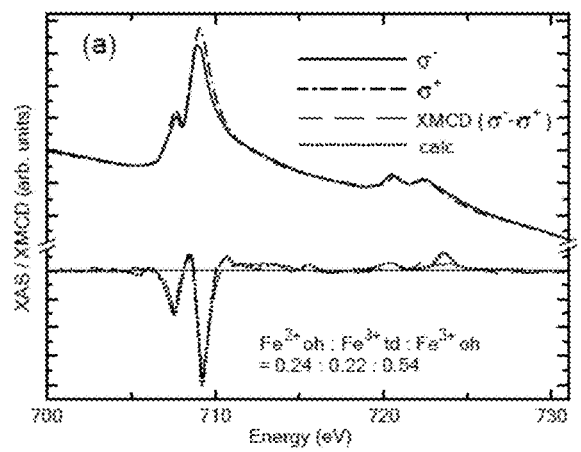
FIGS. 8A-8D show a set of XAS (X-ray absorption spectroscopy) and XMCD (X-ray magnetic circular dichroism) spectra of M-type hexaferrite thin films having the composition $SrFe_8Ti_2Co_2O_{19}$. The thin films were prepared using $SrFe_{(4-\delta)}Ti_{0.5\delta}Co_{0.5\delta}O_7$ and $Fe_{(1+0.25\delta)}Ti_{0.5(1-0.25\delta)}Co_{0.5(1-0.25\delta)}O_3$ as targets.
Figure 8B:
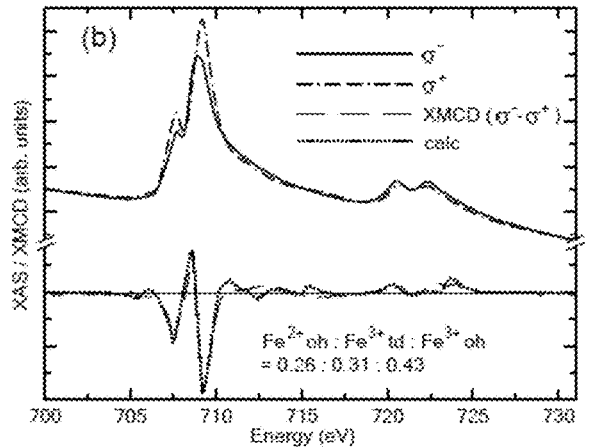
Figure 8C:
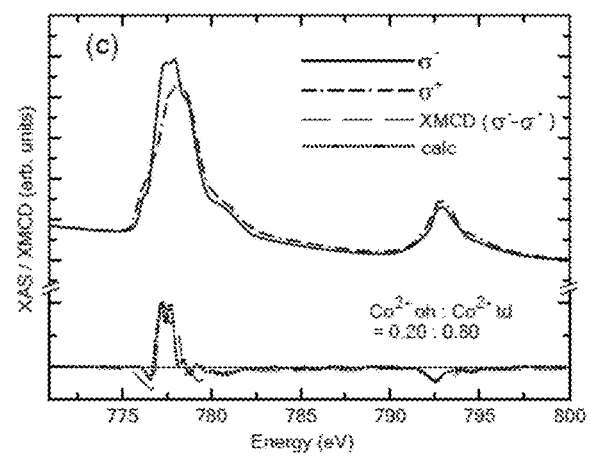
Figure 8D:
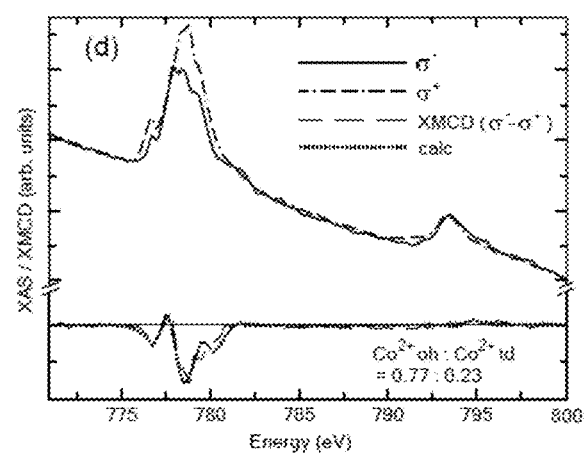

XAS (X-ray absorption spectroscopy) and XMCD (X-ray magnetic circular dichroism) measurements were carried out to assess occupancy of tetrahedral sites by Co ions. FIGS. 8C and 8D each show data obtained using XAS (upper half) and XMCD (bottom half), respectively, at the Fe(Co) $L_{2,3}$ edges. Briefly, XMCD is a difference spectrum of two x-ray absorption spectra (XAS) taken in a magnetic field, one taken with left circularly polarized light and another with right circularly polarized light. Analyzing the difference in XAS gives information about the spin, the orbital magnetic moment, valence states, occupancies, and magnetic properties. The XAS and XMCD line shapes are typical of $Co^{2+}$ in a tetrahedral ($T_d$) crystal field. Fits to the XMCD data using atomic multiplet calculations show that the majority of the XMCD signal is due to tetrahedral Co (about 80%) with a 20% contribution from Octahedral ($O_h$) Co. As can be seen from FIGS. 8A-8D, the sign of the XMCD peak is positive, which is opposite to the majority of the Fe peaks (compare the bottom halves of the top and bottom panels of FIG. 8A) indicating that Co is aligned anti-parallel to the majority of the Fe spins. Thus for $\delta=0$, the Co was mainly substituted into the $T_d$ sites, which reside in the S block, whilst Ti entered the $O_h$ sites. However, Ti prefers the 12k positions, and so for $\delta=0$ the data are consistent with the aim to substitute Co—Ti into the S block only. Note that the target that simulates S block contains Ti and Co ions, whereas the other target containing only Sr and Fe ions simulates R block. Therefore, Ti and Co ions must be deposited in the S block. This was confirmed by the XMCD measurements.

Example 4

Magnetoelectric Coupling as a Function of Applied Voltage

Figure 9:
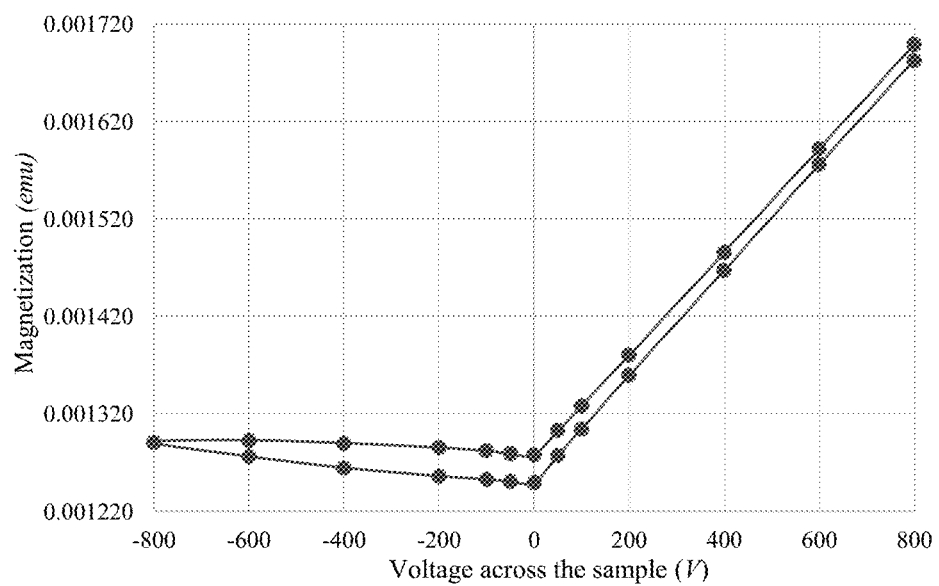
FIG. 9 is a graph showing change in magnetization of M-type hexaferrite thin films (described in FIGS. 8A-8D) as a function of applied voltage. The data points used were obtained using targets with 6 of 0.2.

Magnetoelectric coupling was found to vary in a linear manner with applied voltage. See FIG. 9. For positive and negative voltages, the applied electric field (E) is in phase (i.e., parallel) or in opposition, respectively, to the direction of magnetization. Although variation of voltage from positive to negative is accompanied with hysteretic effects, the slope for positive voltages is linear, allowing magnetoelectric coupling to be deduced.

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims.

What is claimed is:

1. A method of making a magnetoelectric ferrite thin film in which a portion of the iron ions in the ferrite are substituted by ions of at least one of titanium and cobalt, the substituting ions occupying both tetrahedral and octahedral sites in the unit cell of the ferrite crystal, the method comprising the steps of:
   (a) providing a substrate and a plurality of targets, wherein a first target is $SrFe_{(4-\delta)}Ti_{0.5\delta}Co_{0.5\delta}O_7$, which is used to form an R block in the unit cell, wherein $\delta$ is 0.2;
   (b) placing each target, one at a time, in sufficient proximity to the substrate to allow ion depositing;
   (c) ablating the target thus situated using laser pulses, thereby causing ions from the target to deposit on the substrate;
   (d) repeating steps (b) and (c), thereby generating a film; and
   (e) annealing the film in the presence of oxygen;
wherein the plurality of targets, the sequence of their ablation, and the number of laser pulses that each target is subjected to, are selected so as to allow the substituting ions to occupy both tetrahedral and octahedral sites in the unit cell, whereby the ferrite thin film is produced.

2. The method of claim 1, wherein the ferrite is a hexaferrite of the M-, U-, W-, X-, Y-, or Z-type.

3. The method of claim 1, wherein the ferrite is an M-type hexaferrite.

4. The method of claim 3, wherein the M-type hexaferrite has the composition $Sr^{2+}Co_x^{2+}Ti_{3-0.5x}^{4+}Fe_8^{3+}O_{19}^{2-}$, wherein x is from 1.2 to 3.5.

5. The method of claim 4, wherein x is 2.0.

6. The method of claim 1, wherein a second target is provided, and the second target is $Fe_{(1+0.25\delta)}Ti_{0.5(1-0.25\delta)}Co_{0.5(1-0.25\delta)}O_3$, which is used to form an S block in the unit cell, wherein $\delta$ is 0.2.

7. The method of claim 6, wherein the laser pulses used for ablation of the first and the second targets are unequal in number.

8. The method of claim 7, wherein the substrate is heated to 600° C.

9. The method of claim 8, wherein step (e) is carried out at 1050° C. for 40 minutes.

10. A method of making a magnetoelectric ferrite thin film, comprising:
(a) providing a ferrite substrate and a plurality of targets comprising at least one of titanium compounds and cobalt compounds, wherein a first target is $SrFe_{(4-\delta)}Ti_{0.5\delta}Co_{0.5\delta}O_7$, which is used to form an R block in the unit cell, wherein a second target is $Fe_{(1+0.25\delta)}Ti_{0.5(1-0.25\delta)}Co_{0.5(1-0.25\delta)}O_3$, which is used to form an S block in the unit cell, and wherein $\delta$ is equal to 0.2 for the first and second targets;
(b) placing each target, one at a time, in sufficient proximity to the ferrite substrate so as to allow ion depositing;
(c) ablating the target using laser pulses, thereby causing at least one of titanium ions and cobalt ions from the target to deposit on the ferrite substrate, wherein the deposited ions occupy both tetrahedral and octahedral sites in a unit cell of the ferrite substrate;
(d) repeating steps (b) and (c), thereby generating a magnetoelectric ferrite thin film; and
(e) annealing the film in the presence of oxygen.

11. The method of claim 10, wherein both titanium ions and cobalt ions from the target are deposited on the ferrite substrate.

* * * * *